United States Patent
Morinishi et al.

(10) Patent No.: US 6,260,562 B1
(45) Date of Patent: Jul. 17, 2001

(54) SUBSTRATE CLEANING APPARATUS AND METHOD

(75) Inventors: Kenya Morinishi; Masami Ohtani; Joichi Nishimura; Akihiko Morita, all of Kyoto (JP)

(73) Assignee: Dainippon Screen MFG. Co., Ltd., Kyoto (JP)

(*) Notice: Subject to any disclaimer, the term of this patent is extended or adjusted under 35 U.S.C. 154(b) by 0 days.

(21) Appl. No.: 09/166,593

(22) Filed: Oct. 6, 1998

(30) Foreign Application Priority Data

Oct. 20, 1997 (JP) ................................... 9-286729
Oct. 20, 1997 (JP) ................................... 9-286730

(51) Int. Cl.[7] ................................................. B08B 3/02
(52) U.S. Cl. ................... 134/57 R; 134/56 R; 134/58 R; 134/113; 134/902; 134/181
(58) Field of Search ................. 134/56 R, 57 R, 134/58 R, 113, 181, 32, 902, 25.4, 33; 222/55

(56) References Cited

U.S. PATENT DOCUMENTS

| | | | |
|---|---|---|---|
| 4,564,280 | * 1/1986 | Fukuda | 134/902 |
| 5,364,474 | * 11/1994 | Williford, Jr. | 134/32 |
| 5,532,192 | * 7/1996 | Adams . | |
| 5,785,068 | * 7/1998 | Sasaki et al. | 134/902 |
| 5,947,134 | * 9/1999 | Kim et al. | 134/902 |
| 5,975,098 | * 11/1999 | Yoshitani et al. | 134/153 |
| 5,980,647 | * 11/1999 | Bunker et al. . | |

FOREIGN PATENT DOCUMENTS

| | | | |
|---|---|---|---|
| 3-218016 | * 9/1991 | (JP) | 134/902 |
| 3-286530 | * 12/1991 | (JP) | 134/902 |
| 4-44227 | * 2/1992 | (JP) | 134/902 |
| 4-260326 | * 9/1992 | (JP) | 134/902 |
| 6-120136 | * 4/1994 | (JP) | 134/902 |

* cited by examiner

Primary Examiner—Frankie L. Stinson
(74) Attorney, Agent, or Firm—Arent Fox Kintner Plotkin & Kahn, PLLC

(57) ABSTRACT

A substrate cleaning apparatus includes a spin support for supporting and spinning a substrate, a nozzle for discharging a cleaning liquid with a given cleaning condition from a discharge opening, a moving mechanism for moving the nozzle at least between center and edge of the substrate, a cleaning condition adjuster for adjusting the cleaning condition, and a controller for controlling the cleaning condition adjuster to vary the cleaning condition according to a cleaning liquid supply position movable over the substrate surface.

12 Claims, 11 Drawing Sheets

SUBSTRATE CLEANING APPARATUS AND METHOD

BACKGROUND OF THE INVENTION (1) Field of the Invention

The present invention relates to substrate cleaning apparatus and methods for supplying a cleaning liquid from a nozzle to and cleaning substrates such as semiconductor wafers, glass substrates for photomasks, glass substrates for liquid crystal displays, substrates for optical disks and the like. More particularly, the invention relates to a technique of performing a cleaning process while moving a nozzle so that a cleaning liquid supply position on a surface of a substrate moves at least between center and edge of the substrate.

(2) Description of the Related Art

A conventional substrate cleaning apparatus of the type noted above includes, for example, a spin support mechanism for supporting and spinning a substrate, a jet nozzle for discharging a high-pressure jet of cleaning liquid under a fixed pressure, and a moving mechanism for moving the nozzle so that a cleaning liquid supply position on the surface of the substrate moves at a fixed speed at least between center and edge of the substrate.

This apparatus supplies the cleaning liquid over the entire surface of the substrate by moving the nozzle while spinning the substrate, so that the cleaning liquid supply position on the surface of the substrate moves at least between center and edge of the substrate. In this way, the substrate surface is cleaned with particles of dust and the like removed therefrom.

The cleaning liquid discharge pressure is one of the cleaning conditions that greatly influence the effect of cleaning. Thus, the discharge pressure is varied for each lot of substrates with different degrees of particle adhesion, for each type of substrate or for each individual substrate.

The above conventional apparatus has the following drawback.

The substrate in a spin moves, in a central region thereof, at low speed relative to the nozzle, and at increasing speed toward the edge. The central region of the substrate moving at low relative speed may undergo an excessive impact of the cleaning liquid. Generally, the cleaning liquid discharge pressure which is one of the cleaning conditions is set to achieve an optimal cleaning result for the central region of the substrate. With the discharge pressure selected to suit the central region, edge regions of the substrate moving at high relative speed cannot be cleaned sufficiently. Such uneven cleaning results have adverse effects on subsequent substrate treatment.

A different substrate cleaning apparatus includes, instead of the above jet nozzle, a nozzle for discharging a cleaning liquid with ultrasonic vibration of a fixed frequency. This apparatus supplies the cleaning liquid with ultrasonic vibration over the entire surface of a substrate by reciprocating the nozzle over the substrate surface while spinning the substrate at a fixed speed. In this way, the substrate surface is cleaned with particles of dust and the like removed therefrom by ultrasonic vibration.

An ultrasonic frequency or output applied to the cleaning liquid is one of the cleaning conditions that greatly influence the effect of cleaning. Thus, the ultrasonic frequency or output is varied for each lot of substrates with different degrees of particle adhesion, for each type of substrate or for each individual substrate.

This conventional apparatus also has the following drawback.

The substrate moves, in a central region thereof, at low speed relative to the nozzle, and at increasing speed toward the edge. The central region of the substrate moving at low relative speed may undergo an excessive impact of the ultrasonic vibration applied to the cleaning liquid. Generally, the ultrasonic output which is one of the cleaning conditions is set to achieve an optimal cleaning result for the central region of the substrate. With the ultrasonic output selected to suit the central region, edge regions of the substrate moving at high relative speed cannot be cleaned sufficiently. Such uneven cleaning results have adverse effects on subsequent substrate treatment.

SUMMARY OF THE INVENTION

The present invention has been made having regard to the state of the art noted above, and its object is to provide a substrate cleaning apparatus and method for uniformly cleaning an entire surface of a substrate by varying cleaning conditions according to a cleaning liquid supply position moving over the substrate surface.

The above object is fulfilled, according to the present invention, by a substrate cleaning apparatus comprising:

a spin support device for supporting and spinning a substrate;

a nozzle for discharging a cleaning liquid with a given cleaning condition from a discharge opening;

a moving device for moving the nozzle over a surface of the substrate such that a supply position in which the cleaning liquid discharged from the nozzle is supplied moves at least between center and edge of the substrate;

a cleaning condition adjusting device for adjusting the cleaning condition; and a control device for controlling the cleaning condition adjusting device to vary the cleaning condition according to the supply position movable over the surface of the substrate.

The substrate spun by the spin support device has a moving speed relative to the nozzle which varies from position to position on the substrate surface. However, the control device controls the cleaning condition adjusting device to vary the cleaning condition according to the cleaning liquid supply position on the substrate surface, thereby to assure a constant level of cleaning. Consequently, the entire surface of the substrate is cleaned uniformly.

Preferably, the cleaning condition is a discharge pressure of the cleaning liquid discharged from the discharge opening of the nozzle, the cleaning condition adjusting device is a discharge pressure adjusting device for adjusting the discharge pressure, and the control device is operable for controlling the discharge pressure adjusting device to adjust the discharge pressure according to the supply position movable over the surface of the substrate.

The control device controls the discharge pressure adjusting device to adjust the discharge pressure according to the cleaning liquid supply position movable over the substrate surface. Consequently, the same level of cleaning is obtained for any position on the substrate surface.

It is also preferred that the cleaning condition is an ultrasonic output applied to the cleaning liquid discharged from the nozzle, the cleaning condition adjusting device is an ultrasonic output adjusting device for adjusting the ultrasonic output, and the control device is operable for controlling the ultrasonic output adjusting device to adjust the ultrasonic output according to the supply position movable over the surface of the substrate.

The control device controls the ultrasonic output adjusting device to adjust the ultrasonic output applied to the cleaning liquid according to the cleaning liquid supply position. Thus, a constant level of cleaning is obtained over the entire surface of the substrate spun by the spin support device. The ultrasonic output may be varied to fix the level of cleaning, thereby to clean the entire surface of the substrate uniformly with relative ease.

Preferably, the substrate cleaning apparatus according to the invention further comprises a position detecting device for detecting the supply position movable over the surface of the substrate, the control device being operable for controlling the cleaning condition adjusting device based on the supply position detected by the position detecting device.

The control device controls the cleaning condition adjusting device based on the cleaning liquid supply position over the substrate surface detected by the position detecting device. Thus, the cleaning condition may be adjusted according to the cleaning liquid supply position accurately detected, to ensure a constant level of cleaning. Consequently, the entire surface of the substrate is cleaned uniformly with increased assurance.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

First Embodiment

Figure 1:
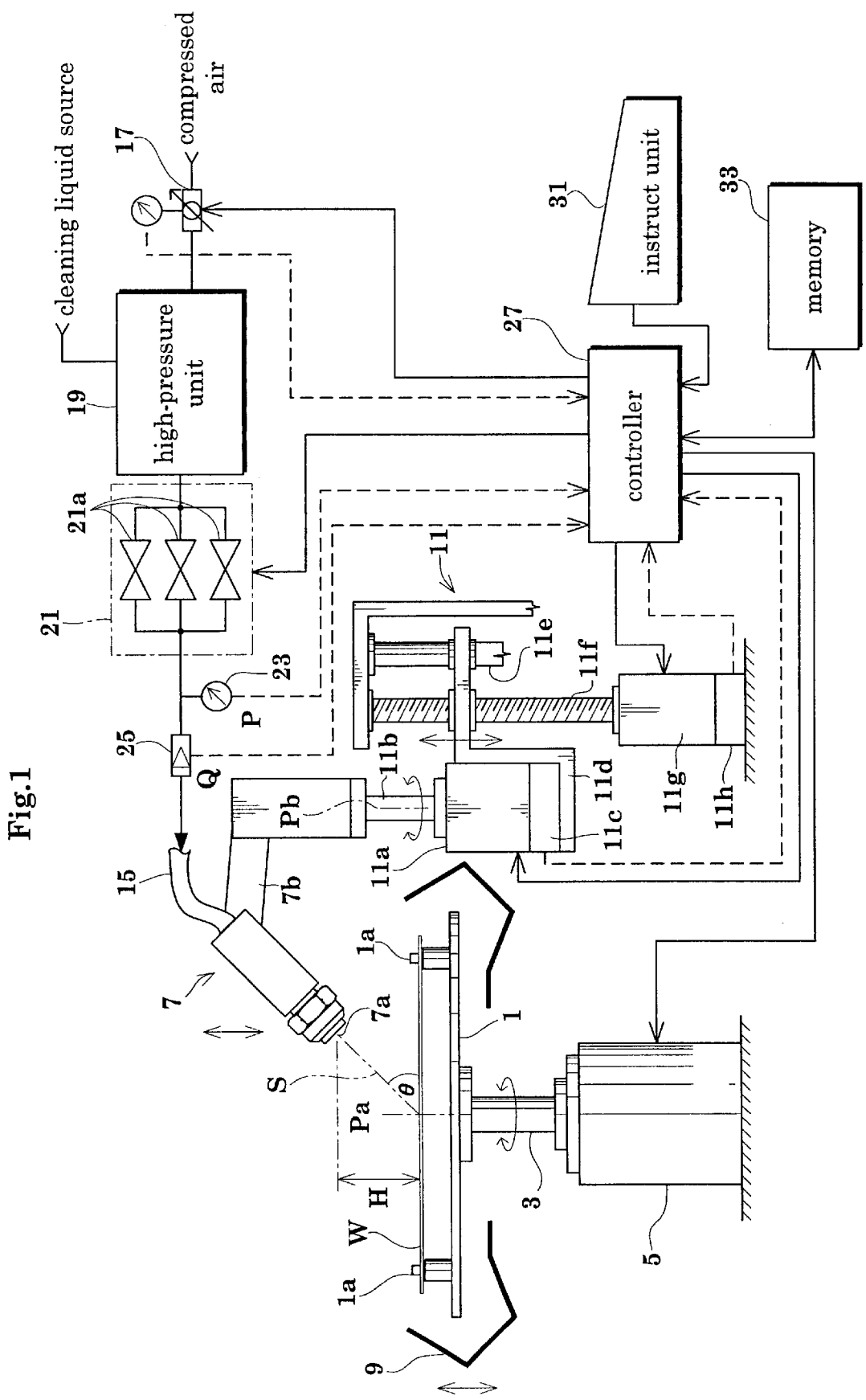
FIG. 1 is a block diagram showing an outline of a substrate cleaning apparatus in a first embodiment.
Figure 2:
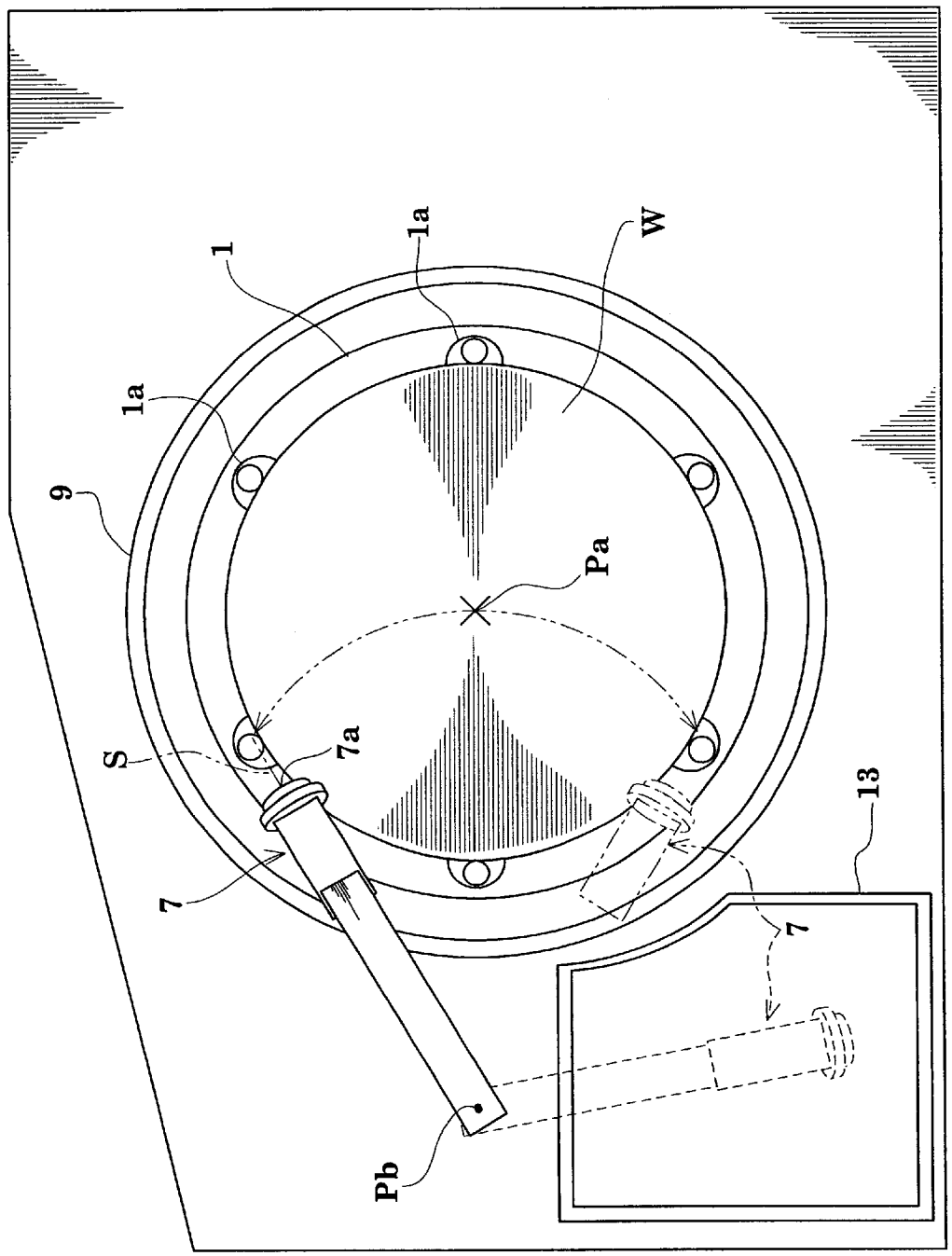
FIG. 2 is a plan view of the substrate cleaning apparatus in the first embodiment.

FIG. 1 is a block diagram showing an outline of a substrate cleaning apparatus in a first embodiment of the invention. FIG. 2 is a plan view of the substrate cleaning apparatus.

A disk-shaped spin chuck 1 having six cylindrical support pins 1a erected thereon is spun by an electric motor 5 through a rotary shaft 3 connected to the bottom of spin chuck 1. With a spin of spin chuck 1, a wafer W supported at edges thereof by the support pins 1a spins in a horizontal plane about a spin center Pa. The spin chuck 1 is surrounded by a scatter preventive cup 9 for preventing scattering of a cleaning liquid or solution S discharged from a nozzle 7.

The scatter preventive cup 9 is moved vertically relative to the spin chuck 1 as indicated by an arrow in FIG. 1, when a wafer W to be cleaned is placed on the spin chuck 1 and when a transport device not shown receives a cleaned wafer W from the spin chuck 1. The spin chuck 1, rotary shaft 3 and electric motor 5 constitute the spin support device of the present invention.

The nozzle 7 supplies the cleaning solution S under high pressure at a fixed discharge angle θ from a discharge opening 7a to the surface of wafer W. The nozzle 7 is swingable by a lifting/moving mechanism 11 such that the supply position of nozzle 7 moves over the spin center Pa. The nozzle 7 has a support arm 7b attached adjacent a rear end thereof and coupled to a rotary shaft 11b of a rotary motor 11a. The rotary motor 11a swings the nozzle 7 about a center of rotation Pb to move over the wafer W. An amount of rotation is detected by an encoder 11c and fed back to a controller 27 described hereinafter.

The rotary motor 11a, rotary shaft 11b and encoder 11c constitute to the moving device of the present invention for moving the nozzle 7. The encoder 11c corresponds to the position detecting device of the present invention. The encoder 11c directly detects a position of nozzle 7 to detect a cleaning solution supply position movable over the wafer surface.

The rotary motor 11a and encoder 11c are mounted on a lift deck 11d slidably fitted on a vertical guide rod 11e, and meshed with a ball screw 11f extending parallel to the guide rod 11e. The ball screw 11f is operatively connected to a rotary shaft of a lift motor 11g. An amount of vertical movement is detected as an amount of rotation by an encoder 11h and fed back to the controller 27 described hereinafter. When the lift motor 11g is driven with the nozzle 7 in a cleaning position over the wafer W, the nozzle 7 is vertically moved to adjust a height of discharge opening 7a (discharge height H) above the surface of wafer W. Thus, the guide rod 11e, ball screw 11f, lift motor 11g and encoder 11h constitute the cleaning condition adjusting device and discharge height adjusting device of the present invention.

The nozzle 7 is vertically movable and horizontally swingable by the lifting/moving mechanism 11. When not supplying the cleaning solution S to the wafer W, the nozzle 7 is moved to a standby position shown in dotted lines in FIG. 2, to stand by in a standby pot 13 disposed adjacent the scatter preventive cup 9.

The cleaning solution S is supplied to the nozzle 7 through a piping 15 including an electropneumatic change valve 17 for varying a pressure of compressed air to a pressure corresponding to an electric signal inputted, a high-pressure unit 19 for adjusting a pressure of cleaning solution S supplied from a cleaning solution source according to a pressure received from the electropneumatic change valve 17, a flow control unit 21 having a plurality of electromagnetic valves 21a disposed on separate passages for adjusting a flow rate of cleaning solution S, a pressure sensor 23 for detecting a pressure P of cleaning solution S outputted from the flow control unit 21, and a flow rate sensor 25 for detecting a flow rate Q of cleaning solution S. The electropneumatic change valve 17 receives an electric signal from the controller 27 acting as the control device of the present invention, to adjust an air pressure to a pressure corresponding to this electric signal. The adjusted pressure is detected by a pressure sensor provided for the electropneumatic change valve 17, which is fed back to the controller 27. Detection signals P and Q of pressure sensor 23 and flow rate sensor 25 also are fed back to the controller 27 for controlling the high-pressure unit 19 and flow control unit 21.

The electropneumatic change valve 17 and high-pressure unit 19 constitute the cleaning condition adjusting device and discharge pressure adjusting device of the present invention. The flow control unit 21 corresponds to the cleaning condition adjusting device and discharge quantity adjusting device of the present invention.

As noted above, various signals are inputted to the controller 27. Further, an instruct unit 31 is connected to the controller 27. The instruct unit 31 is used for preparing a plurality of cleaning programs (also called recipes) by instructing desired cleaning conditions including discharge pressure P of cleaning solution S, and selecting a desired one of the cleaning programs. A memory 33 for storing the cleaning programs also is connected to the controller 27.

Figure 3:
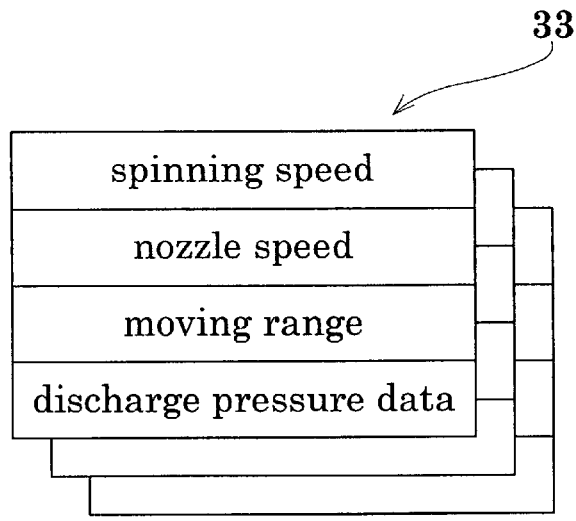
FIG. 3 is a schematic view of cleaning programs stored in a memory.

The cleaning programs are prepared for different types of wafers W. As schematically shown in FIG. 3, for example, each program includes a spinning speed of wafer W during a cleaning process, a moving speed of nozzle 7 during the cleaning process, a moving range of nozzle 7 swung over the wafer W, and discharge pressure data indicating discharge pressures of cleaning solution S corresponding to positions over the surface of wafer W.

Figure 4:
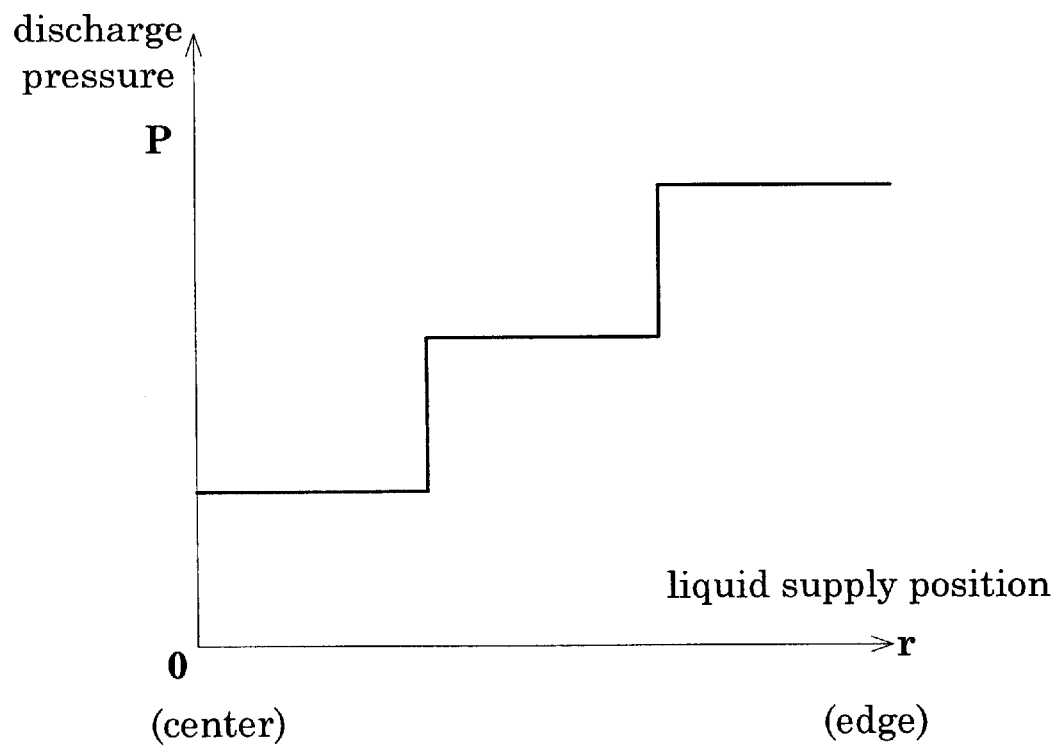
FIG. 4 is a schematic view of discharge pressure data.

The discharge pressure data is set as shown in FIG. 4, for example. In this data, discharge pressure P is set low for a central region of wafer W having a low moving speed relative to the nozzle 7, and is increased in two stages toward the edge of wafer W having a high moving speed relative to the nozzle 7.

When the nozzle 7 is swung in a cleaning operation, the controller 27 varies the electric signal applied to the electropneumatic change valve 17 based on positions of nozzle 7, which are cleaning solution supply positions over the surface of wafer W, detected by the encoder 11c, and the above discharge data. The high-pressure unit 19 then adjusts the pressure P of cleaning solution S according to the discharge pressure data shown in FIG. 4. This assures substantially the same cleaning result in all parts of the surface of wafer W including the central region of low relative moving speed and edge regions of high relative moving speed, Since substantially the same cleaning result is obtained only by adjusting the discharge pressure P, the entire surface of wafer W is cleaned uniformly with relative ease.

The cleaning programs prepared beforehand and stored in the memory 33 and the discharge pressure data are related to each other. Thus, only by designating one of the cleaning programs through the instruct unit 31, the wafer W may be cleaned with discharge pressures suited thereto, and the entire surface of the wafer may be cleaned substantially uniformly.

Figure 5:
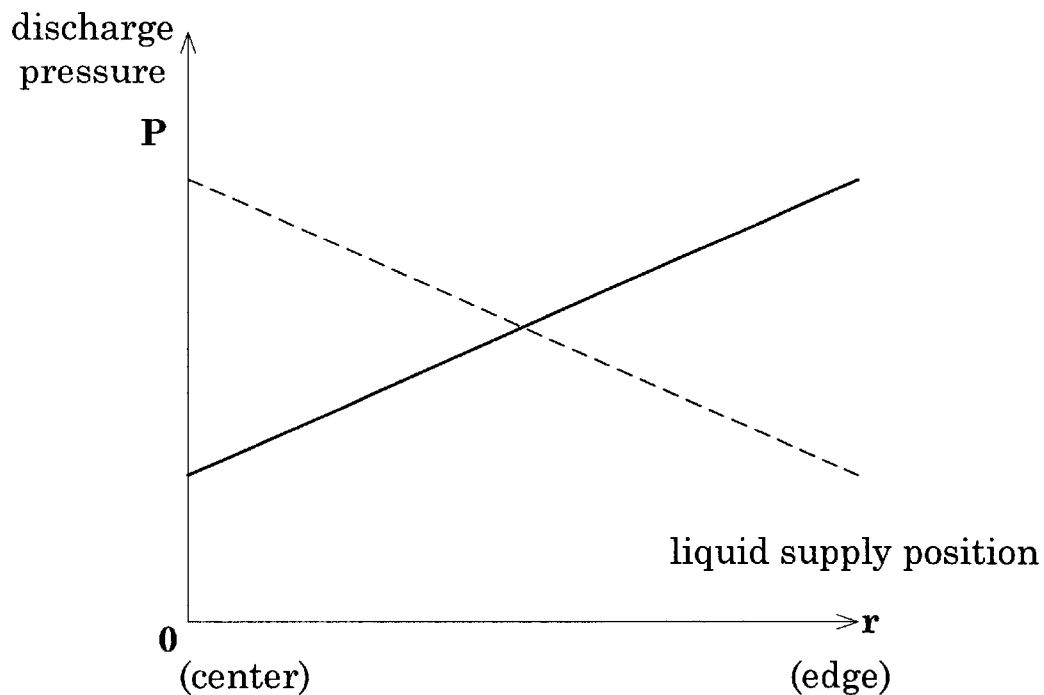
FIG. 5 is a schematic view of a different example of discharge pressure data.

In the above description, the discharge pressure P is varied in stages according to the position of nozzle 7 or the cleaning solution supply position over the wafer W. Alternatively, as shown in a solid line in FIG. 5, the discharge pressure P may varied linearly according to the cleaning solution supply position movable over the wafer W.

In the above description, only the relative moving speed between the nozzle 7 and the surface of wafer W is taken into account, and the level of cleaning with a fixed discharge pressure is lowered toward the edge of wafer W. However, depending on types of particles and surface conditions of wafer W, the level of cleaning with a fixed discharge pressure could be lower toward the center of wafer W. In such a case, as shown in a dotted line in FIG. 5, the discharge pressure P of cleaning solution S has only to be lowered toward the edge of wafer W.

Figure 6:
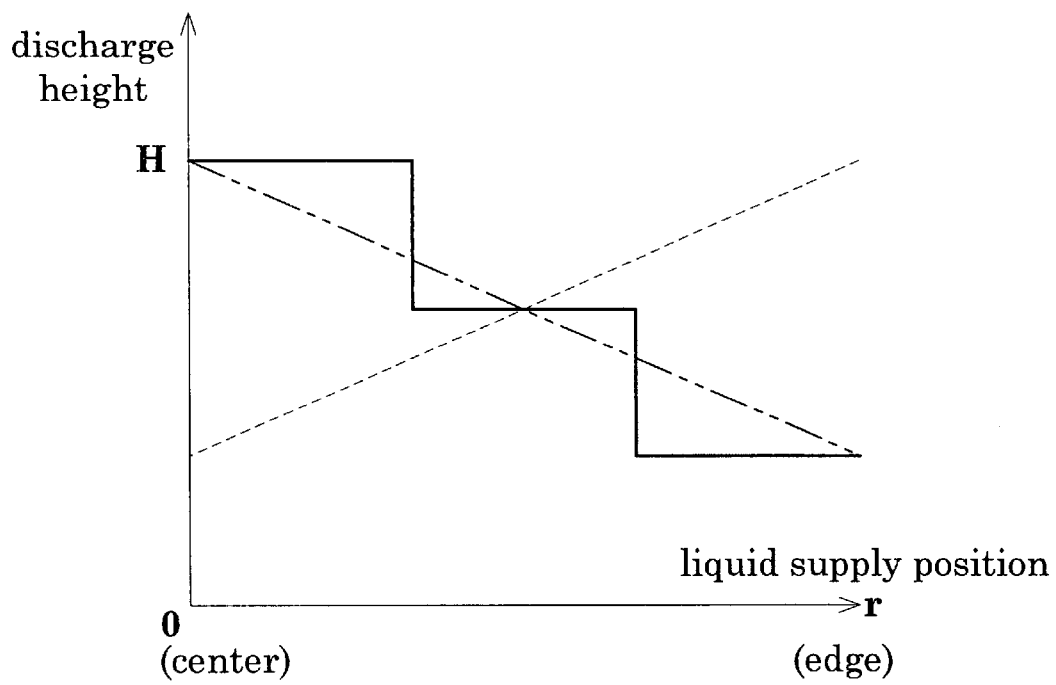
FIG. 6 is a schematic view of discharge height data.

The cleaning conditions for adjusting the level of cleaning include also a discharge height H of opening 7a, i.e. a discharge height H, above the surface of wafer W. In this case, the lift motor 11g is driven to adjust the discharge height H according to the position of nozzle 7 or the cleaning solution supply position over the wafer W as shown in FIG. 6. Specifically, as shown in a solid line in FIG. 6, for example, the discharge height H is lowered in stages from the central region toward the edge. This provides substantially the same cleaning result in all parts of the surface of wafer W. When the nozzle 7 is raised or lowered by the lift motor 11g to vary the discharge height H, the cleaning solution supply position over the surface of wafer W may deviate from the spin center Pa. It is therefore desirable, while varying the discharge height H, to adjust the discharge angle θ by operating a discharge angle adjusting mechanism 35 described hereinafter, to ensure that the cleaning solution S is supplied to the spin center Pa.

The discharge height H may be lowered, instead of variations in stages, linearly toward the edge as shown in a two-dot chain line in FIG. 6. Where the level of cleaning is lower toward the center, the discharge height H may be lowered toward the center as shown in a dotted line in FIG. 6.

Figure 7:
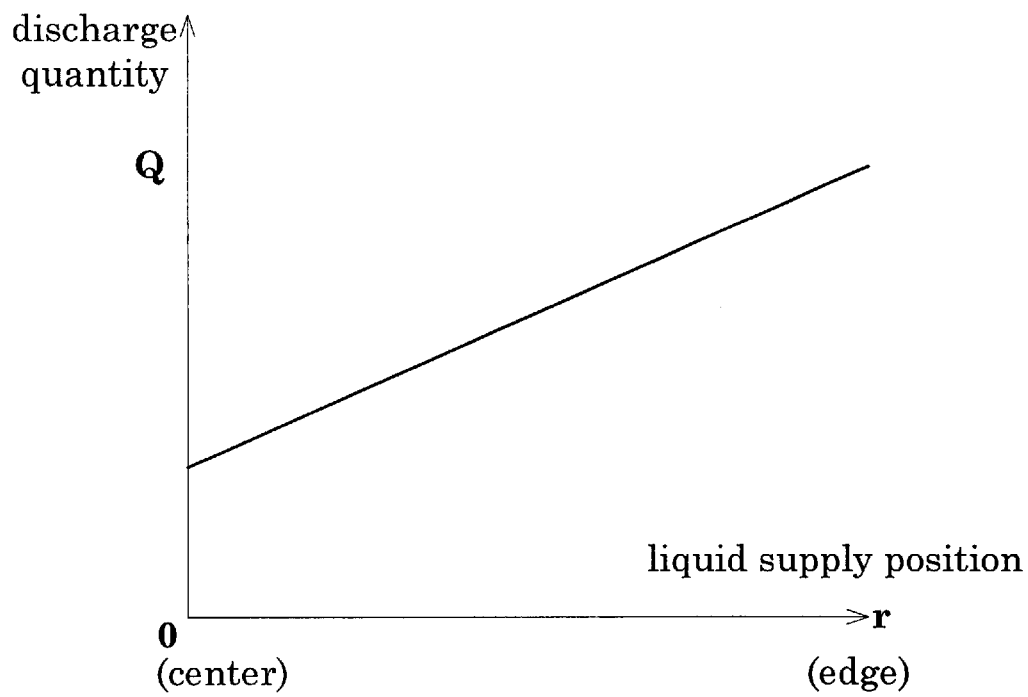
FIG. 7 is a schematic view of discharge quantity data.

The cleaning conditions include also a discharge quantity Q from the nozzle 7 to the wafer W. The discharge quantity Q is adjustable by operating the plurality of electromagnetic valves 21a included in the flow control unit 21. Specifically, as shown in FIG. 7, the discharge quantity Q is increased toward the edge of wafer W to obtain a constant level of cleaning. The discharge quantity Q may be varied in stages as are the discharge pressure P and discharge height H. The discharge quantity Q may be reduced toward the edge of wafer W for the reason noted above.

In the above embodiment, the nozzle 7 has a fixed angle (discharge angle θ) to the surface of wafer W. It is also possible to employ the discharge angle adjusting mechanism 35 (the cleaning condition adjusting device and discharge angle adjusting device) shown in FIG. 8, to vary this angle in response to movement of the cleaning solution supply position over the surface of wafer W.

Figure 8:
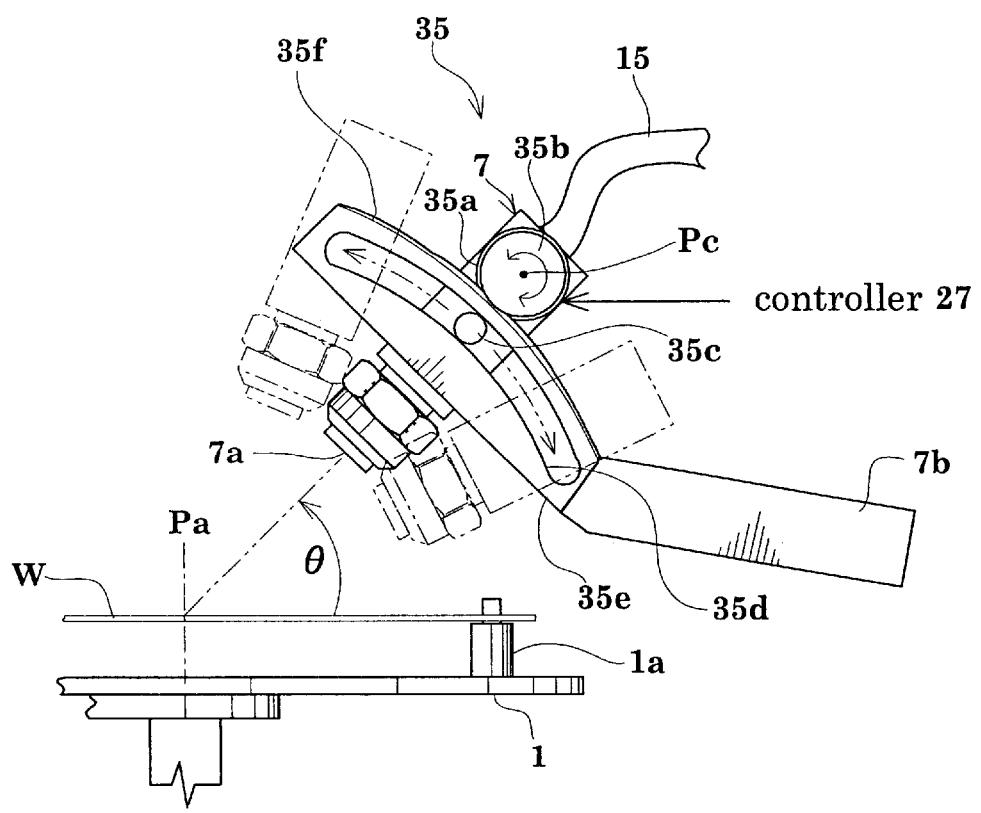
FIG. 8 is a view showing a discharge angle adjusting mechanism.

Specifically, the nozzle 7 includes an angle adjusting motor 35a disposed adjacent the rear end thereof and having a rotary shaft Pc extending transversely of the nozzle 7 (i.e. perpendicular to the plane of FIG. 8). The angle adjusting motor 35a has a gear 35b meshed with a fixed gear 35f of a guide member 35e defining a guide groove 35d for slidably receiving a guide pin 35c projecting from the nozzle 7. When the angle adjusting motor 35a is driven, the guide pin 35c slides along the guide groove 35d to adjust the discharge angle θ for constantly directing the discharge opening 7a to the spin center Pa.

Figure 9:
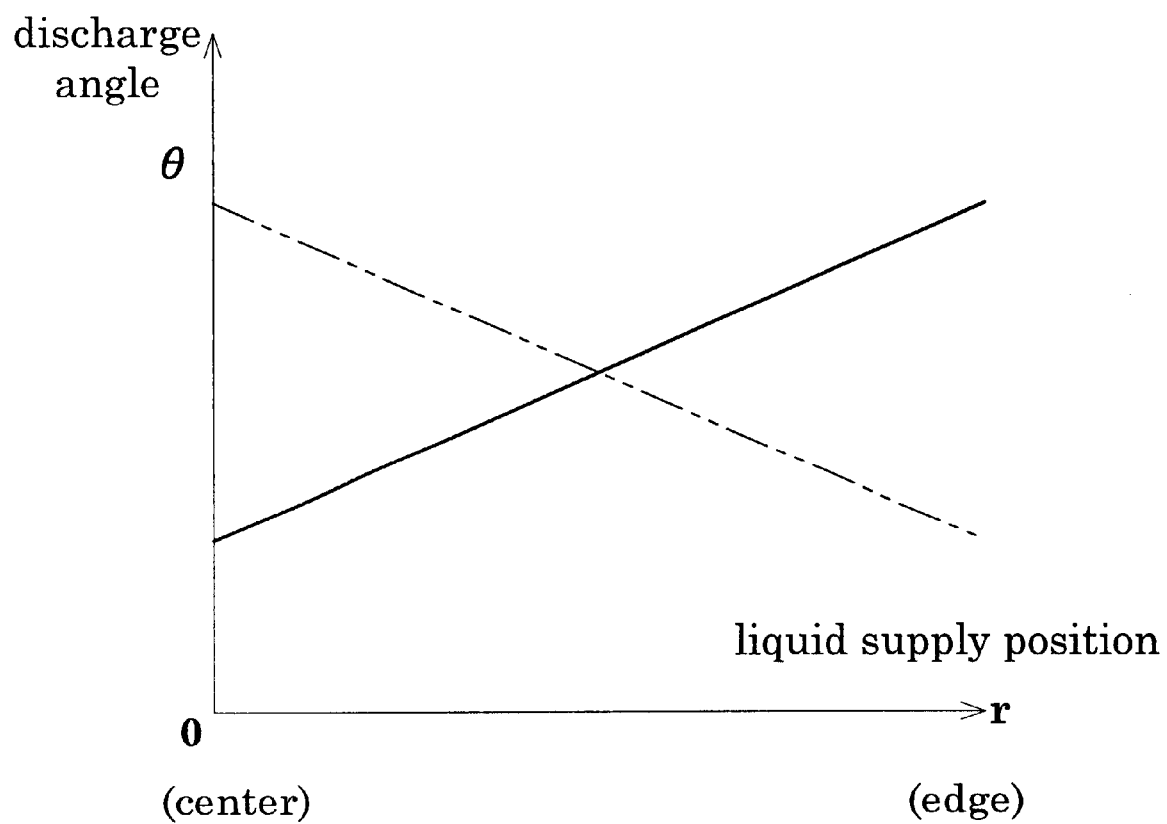
FIG. 9 is a schematic view of discharge angle data.

Where, as noted above, the discharge angle adjusting mechanism 35 is employed to adjust the discharge angle θ, the discharge angle θ may be varied in response to movement of the cleaning solution supply position over the surface of wafer W as shown in FIG. 9, for example. That is, the discharge angle θ is enlarged toward the edge of wafer W as shown in a solid line, or diminished toward the edge of wafer W as shown in a two-dot chain line. How the discharge angle θ should be varied in response to movement of the cleaning solution supply position over the surface of wafer W may be determined from the degrees of adhesion and types of particles of dust and the like.

In the above description, the cleaning conditions such as the discharge pressure P, discharge height H, discharge quantity Q and discharge angle θ are varied individually. It is in accordance with the present invention to vary at least one cleaning condition in response to movement of the cleaning solution supply position over the surface of wafer W. It is possible to vary, for example, the combination of discharge pressure P and discharge height H or the combination of discharge angle θ and discharge height H.

Apart from the cleaning conditions, the moving speed of nozzle 7 may be varied according to the position of nozzle 7 over the surface of wafer W. Specifically, the rotational frequency of rotary motor 11a is varied according to the position of nozzle 7 over the surface of wafer W. For example, the rotational frequency is set high for the central region of wafer W, and lowered toward the edge thereof. The level of cleaning may be made substantially constant also by varying the moving speed of nozzle 7.

The position of nozzle 7 or the cleaning solution supply position over the surface of wafer W is detected by the encoder 11c acting as the position detecting device. The position detected is used in varying the cleaning conditions such as the discharge pressure. The position detecting device of the present invention is not limited to such a construction, but may be modified in various ways. Where, for example, the moving speed and moving range of nozzle 7 are known, the position of nozzle 7 or the cleaning solution supply position may be determined by measuring a time elapsed from a point of time at which the movement started. The cleaning conditions such as the discharge pressure may be adjusted based thereon.

A CCD camera may be used as the position detecting device to detect, from the nozzle 7, an actual cleaning solution supply position over the surface of wafer W, for varying the cleaning conditions such as the discharge pressure.

Second Embodiment

Figure 10:
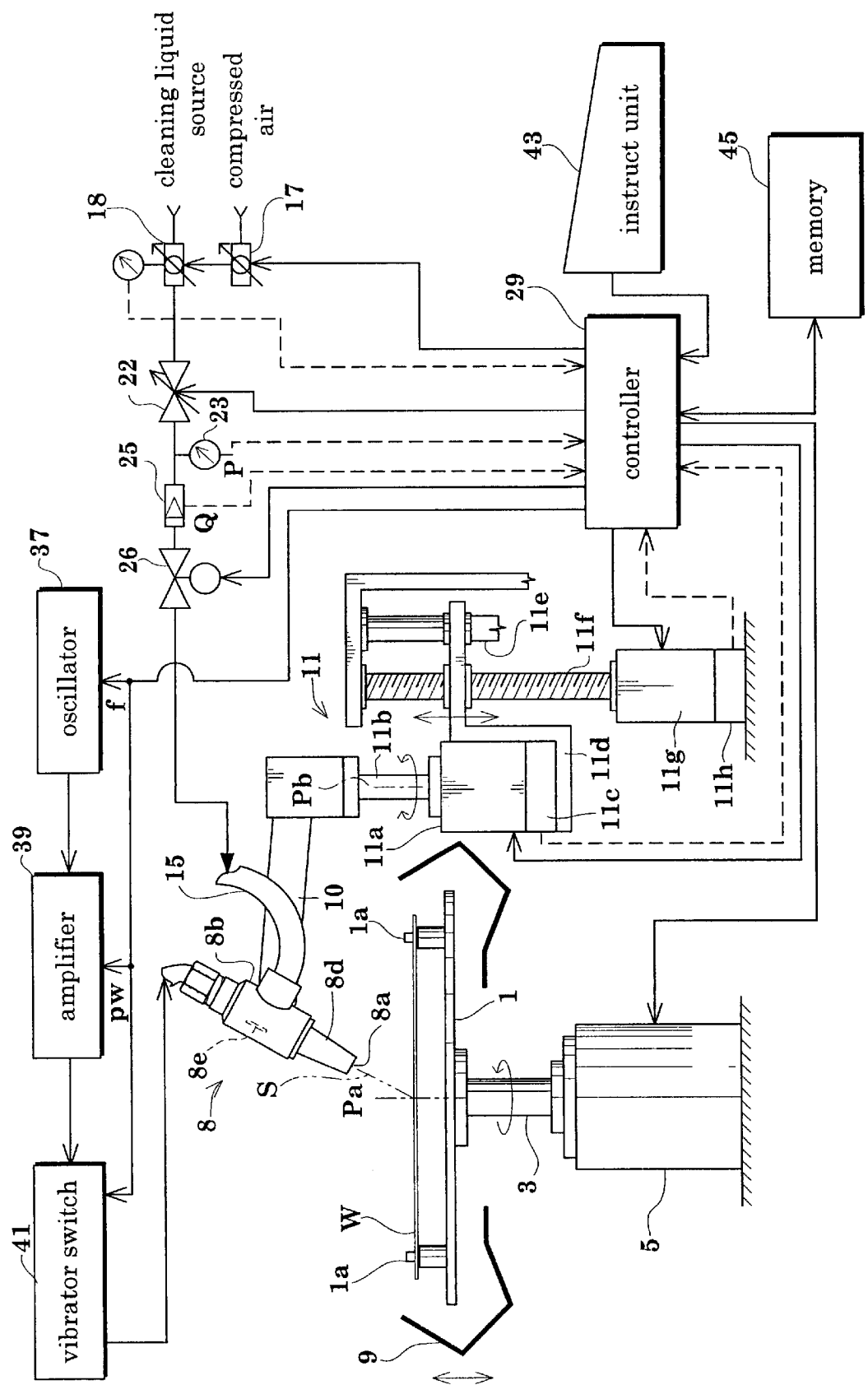
FIG. 10 is a block diagram showing an outline of a substrate cleaning apparatus in a second embodiment.
Figure 11:
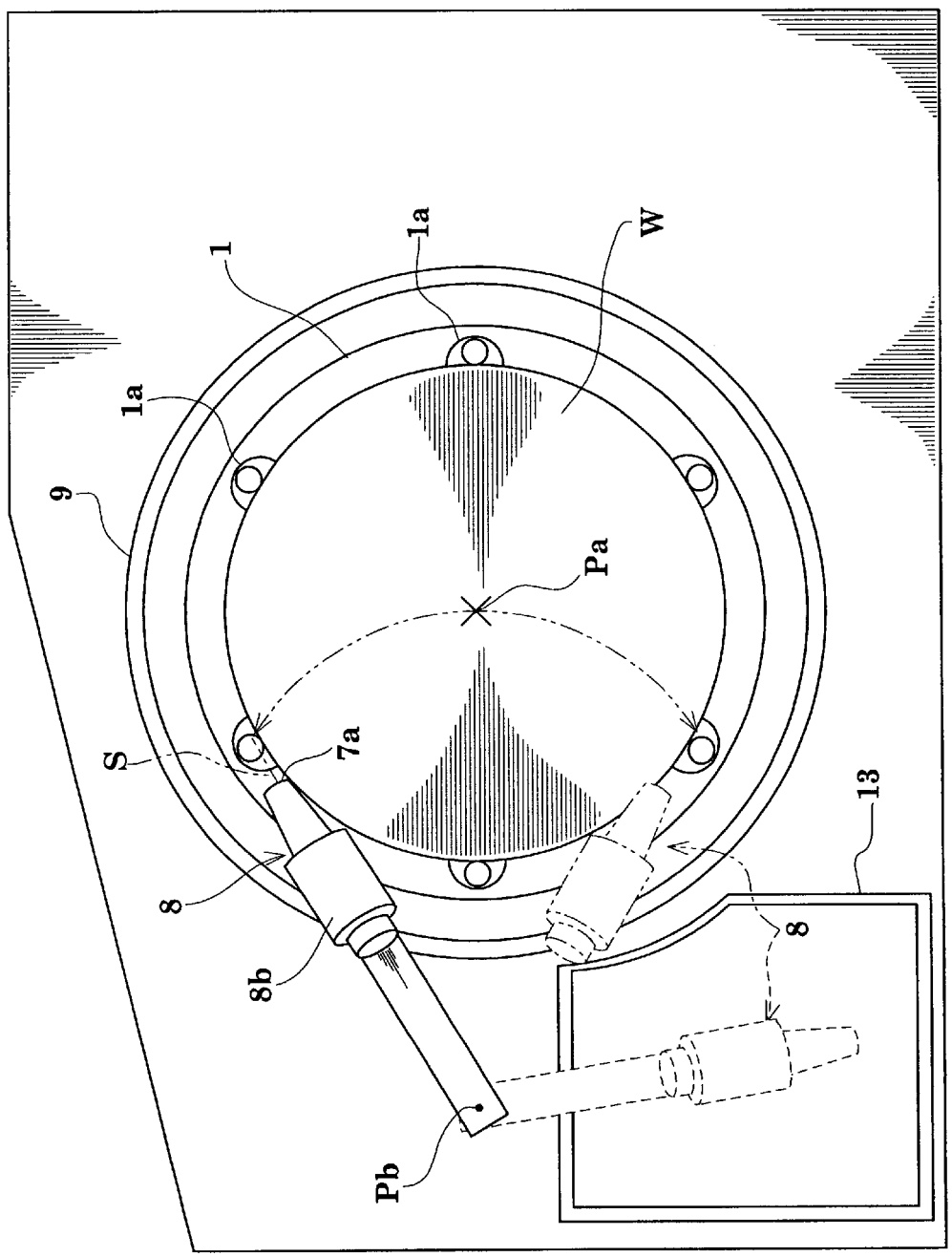
FIG. 11 is a plan view of the substrate cleaning apparatus in the second embodiment.

FIG. 10 is a block diagram showing an outline of a substrate cleaning apparatus in a second embodiment of the invention. FIG. 11 is a plan view of the substrate cleaning apparatus.

A disk-shaped spin chuck 1 having six cylindrical support pins 1a erected thereon is spun by an electric motor 5 through a rotary shaft 3 connected to the bottom of spin chuck 1. With a spin of spin chuck 1, a wafer W supported at edges thereof by the support pins 1a spins in a horizontal plane about a spin center Pa. The spin chuck 1 is surrounded by a scatter preventive cup 9 for preventing scattering of a cleaning liquid or solution S discharged from an ultrasonic nozzle 8. The scatter preventive cup 9 is moved vertically relative to the spin chuck 1 as indicated by an arrow in FIG. 10, when a wafer W to be cleaned is placed on the spin chuck 1 and when a transport device not shown receives a cleaned wafer W from the spin chuck 1. The spin chuck 1, rotary shaft 3 and electric motor 5 constitute the spin support device of the present invention.

The nozzle 8 supplies the cleaning solution S, with ultrasonic vibration applied thereto, from a discharge opening 8a to the surface of wafer W. The nozzle 8 is swingable by a lifting/moving mechanism 11 such that the supply position of nozzle 8 moves over the spin center Pa. The nozzle 8 has a support arm 10 attached to a cylindrical portion 8b thereof and coupled to a rotary shaft 11b of a rotary motor 11a. The rotary motor 11a swings the nozzle 8 about a center of rotation Pb to move over the wafer W. An amount of rotation is detected by an encoder 11c and fed back to a controller 29 described hereinafter.

The rotary motor 11a and encoder 11c are mounted on a lift deck lid slidably fitted on a vertical guide rod 11e, and meshed with a ball screw 11f extending parallel to the guide rod 11e. The ball screw 1f is operatively connected to a rotary shaft of a lift motor 11g. An amount of vertical movement is detected as an amount of rotation by an encoder 11h and fed back to the controller 29 described hereinafter. The nozzle 8 is vertically movable and horizontally swingable by the lifting/moving mechanism 11. When not supplying the cleaning solution S to the wafer W, the nozzle 8 is moved to a standby position shown in dotted lines in FIG. 11, to stand by in a standby pot 13 disposed adjacent the scatter preventive cup 9.

The cleaning solution S is supplied to the nozzle 8 through a piping 15 including an electropneumatic change valve 17 for varying a pressure of compressed air into a pressure corresponding to an electric signal inputted from the controller 29, a pressure control valve 18 for adjusting a pressure of cleaning solution S supplied from a cleaning solution source according to a pressure received from the electropneumatic change valve 17, a flow control valve 22 for adjusting a flow rate of cleaning solution S as instructed by the controller 29, a pressure sensor 23 for detecting a pressure P of cleaning solution S, a flow rate sensor 25 for detecting a flow rate Q of cleaning solution S, and a switch valve 26 operable by the controller 29 to supply or stop the cleaning solution S from the nozzle 8.

The electropneumatic change valve 17 receives an electric signal from the controller 29 acting as the control device of the present invention, to adjust an air pressure to a pressure corresponding to this electric signal. The adjusted pressure is detected by a pressure sensor provided for the pressure control valve 18, which is fed back to the controller 29. Detection signals P and Q of pressure sensor 23 and flow rate sensor 25 also are fed back to the controller 29 for controlling the electropneumatic change valve 17 and flow control valve 22.

Figure 12:
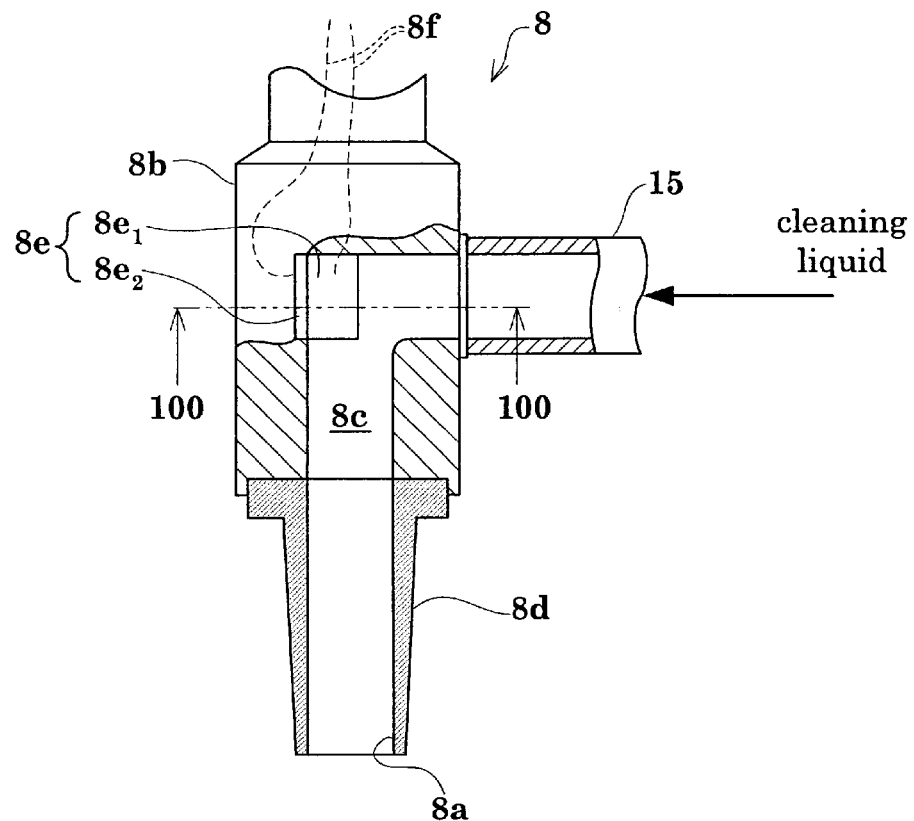
FIG. 12 is a side view partly in section of a nozzle.
Figure 13:
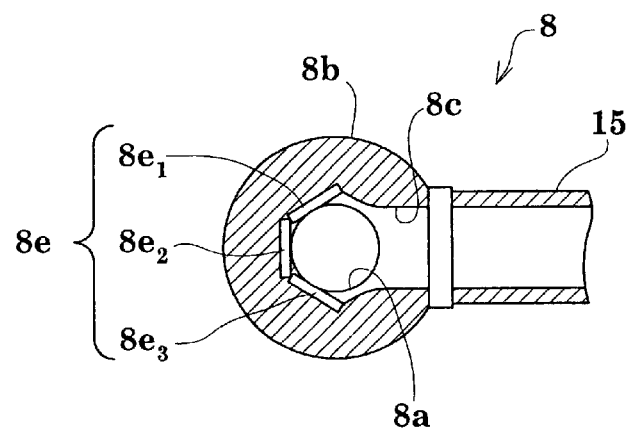
FIG. 13 is a section of the nozzle taken on line 100—100 of FIG. 12.

The nozzle 8 for supplying the cleaning solution S with ultrasonic vibration applied thereto is constructed as shown in FIGS. 12 and 13, for example. FIG. 12 is a side view partly in section of the nozzle 8. FIG. 13 is a section of the nozzle 8 taken on line 100—100 of FIG. 12.

The cylindrical portion 8b defines an inverted L-shaped passage 8c communicating with the piping 15 attached to a side of cylindrical portion 8b. A nozzle tip 8d is fixed to a lower end of cylindrical portion 8b. The nozzle tip 8d has a tapered outward shape, and has a discharge opening 8a formed in a lower surface thereof. Three vibrators 8e (vibrators $8e_1$, $8e_2$ and $8e_3$) are arranged on an upper inner surface of the passage 8c and opposed to the piping 15 for applying ultrasonic vibration to the cleaning solution S. The three vibrators $8e_1$, $8e_2$ and $8e_3$ have different resonance frequencies, e.g. 1.5 MHz, 1.7 MHz and 1.9 MHz. Each of the vibrators $8e_1$, $8e_2$ and $8e_3$ has a cable $8f$ connected thereto for applying a high frequency voltage. The cables $8f$ extend outward from an upper position of the cylindrical portion $8b$. These cables $8f$ are connected to a vibrator selector 41 described hereinafter, whereby the high frequency voltage is applied to one of the cables $8f$.

The vibrators $8e$ are formed by molding a material having a piezoelectric effect and an electrostrictive effect into a shape to provide desired mechanical resonance frequencies (i.e. (frequencies called ultrasonic waves such as 1.5 MHz, 1.7 MHz and 1.9 MHz). Such materials may be crystals having a high piezoelectric effect, and ceramics such as lead zirconate titanate porcelain having a high electrostrictive effect.

Each vibrator $8e_1$, $8e_2$ or $8e_3$ receives a high frequency voltage output pw (or amplitude) of fixed frequency f (one of the three resonance frequencies noted above) through an oscillator 37 and an amplifier 39 controlled by the controller 29. As noted above, each vibrator $8e_1$, $8e_2$ and $8e_3$ has a different resonance frequency. The controller 29 operates the vibrator selector 41 according to the frequency f, whereby the high frequency voltage is applied only to the vibrator $8e$ having approximately the same resonance frequency as the frequency f.

The oscillator 37 is constructed to oscillate in a given frequency corresponding to a signal inputted from the controller 29. The amplifier 39 is constructed to amplify a high frequency signal from the oscillator 37 to an amplitude corresponding to a signal inputted from the controller 29. That is, the ultrasonic frequency and output are adjustable on instructions from the controller 29.

The oscillator 37 corresponds to the cleaning condition adjusting device and frequency adjusting device of the present invention. The amplifier 39 corresponds to the cleaning condition adjusting device and ultrasonic output adjusting device of the present invention.

Further, an instruct unit 43 is connected to the controller 29. The instruct unit 43 is used for preparing a plurality of cleaning programs (also called recipes) by instructing desired cleaning conditions including ultrasonic vibration output pw to be applied to the cleaning solution S, and selecting a desired one of the cleaning programs. A memory 45 for storing the cleaning programs also is connected to the controller 29.

Figure 14:
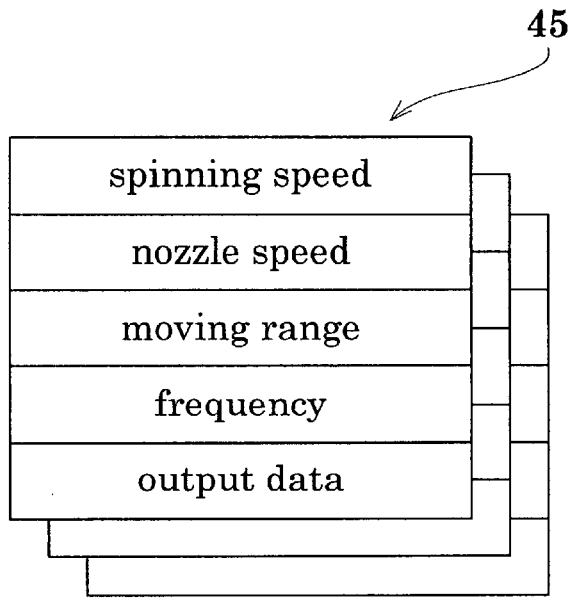
FIG. 14 is a schematic view of cleaning programs stored in a memory.

The cleaning programs are prepared for different types of wafers. As schematically shown in FIG. 14, for example, each program includes a "spinning speed" of wafer W during a cleaning process, a "moving speed" of nozzle 8 during the cleaning process, a "moving range" of nozzle 8 swung over the wafer W, a "frequency" applied to the cleaning solution S and indicating which one of the three vibrators $8e_1$, $8e_2$ and $8e_3$ is used, and "output data" indicating high frequency voltage outputs pw applied to the cleaning solution S and corresponding to cleaning solution supply positions over the surface of wafer W.

Figure 15:
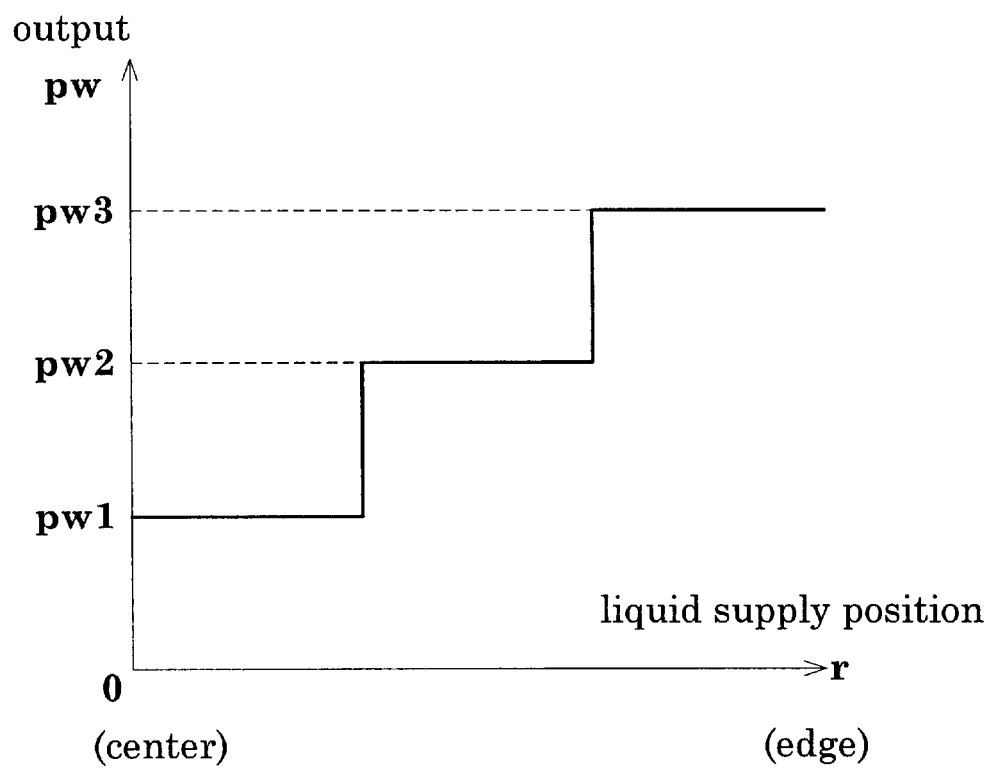
FIG. 15 is a schematic view of output data.

The output data is set as shown in FIG. 15, for example.

In this data, output pw is set to a low output pw1 for a central region of wafer W having a low moving speed relative to the nozzle 8. Output pw is increased to pw2, and then to pw3 for edge regions of wafer W. In this way, output pw is increased in stages toward the edge of wafer W having a high moving speed relative to the nozzle 8.

When the nozzle 8 is swung in a cleaning operation, the controller 29 adjusts the output of amplifier 39, while maintaining the frequency f constant, based on positions of nozzle 8, which are cleaning solution supply positions over the surface of wafer W, detected by the encoder 11c, and the above output data. Consequently, the output of cleaning solution S supplied to the wafer W is adjusted according to the output data shown in FIG. 15. This assures in substantially the same cleaning result in all parts of the surface of wafer W including the central region of low relative moving speed and edge regions of high relative moving speed, Since substantially the same cleaning result is obtained only by adjusting the ultrasonic vibration output pw, the entire surface of wafer W is cleaned uniformly with relative ease.

The cleaning programs prepared beforehand and stored in the memory 45 and the treating solution output data are related to each other. Thus, only by designating one of the cleaning programs through the instruct unit 43, the wafer W may be cleaned with treating solution outputs suited thereto, and the entire surface of the wafer may be cleaned substantially uniformly.

Figure 16:
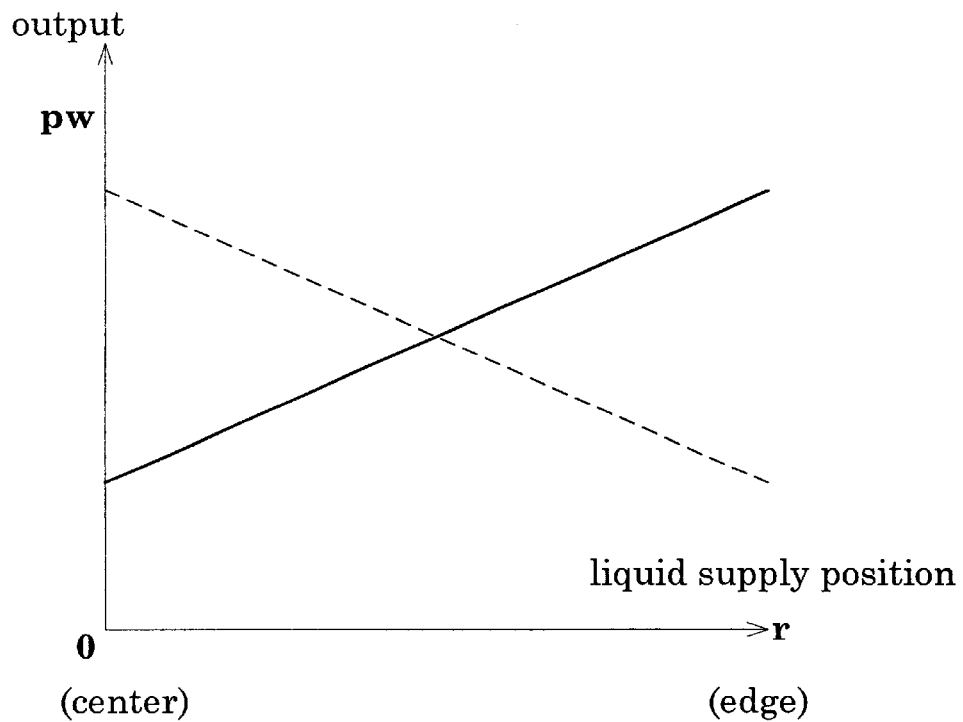
FIG. 16 is a schematic view of a different example of output data.

In the above description, the ultrasonic vibration output pw is varied "in stages" according to the cleaning solution supply position over the wafer W. Alternatively, as shown in a solid line in FIG. 16, the output pw may varied "linearly" according to the cleaning solution supply position over the wafer W.

In the above description, only the relative moving speed between the nozzle 8 and the surface of wafer W is taken into account, and the level of cleaning with a fixed ultrasonic vibration output is lowered toward the edge of wafer W. However, depending on types of particles and surface conditions of wafer W, the level of cleaning with a fixed ultrasonic vibration output could be lower toward the center of wafer W. In such a case, as shown in a dotted line in FIG. 16, the output pw of cleaning solution S has only to be lowered toward the edge of wafer W.

Figure 17:
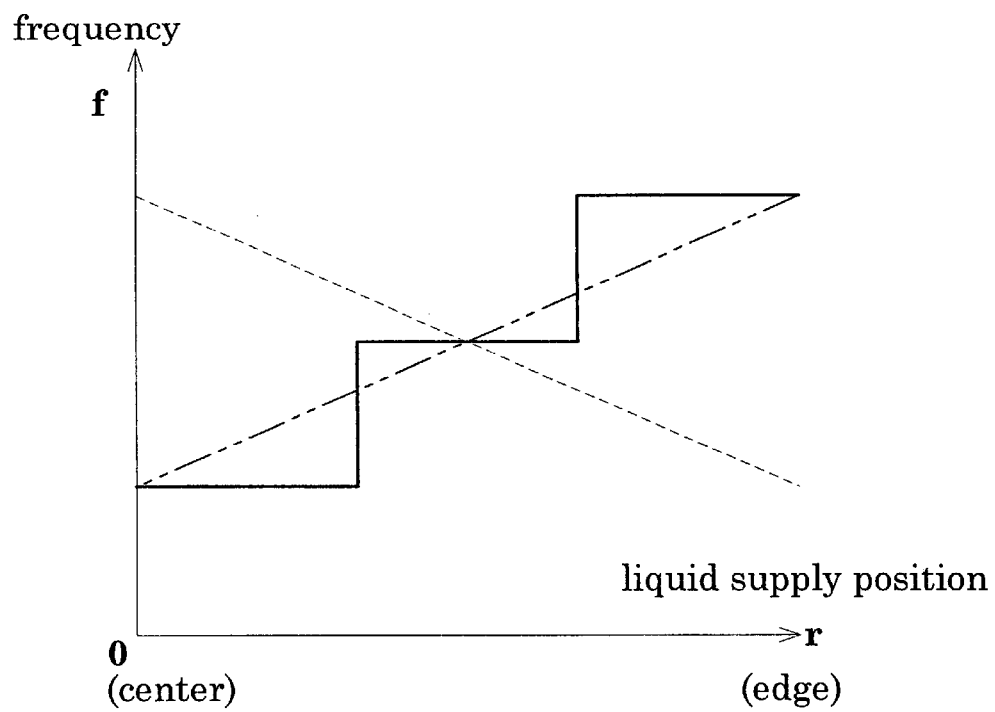
FIG. 17 is a schematic view of frequency data.

The cleaning conditions for adjusting the level of cleaning include also the frequency f of ultrasonic vibration. In this case, the oscillator 37 and vibrator selector 41 are controlled to adjust the frequency f of ultrasonic vibration applied to the cleaning solution S, while maintaining the output pw constant, according to the cleaning solution supply position over the wafer W as shown in FIG. 17. Specifically, as shown in a solid line in FIG. 17, for example, the frequency f of ultrasonic vibration is increased in stages from the central region toward the edge. That is, the vibrator selector 41 is controlled to switch the vibrators $8e$ successively from vibrator $8e_1$ to vibrator $8e_2$ and vibrator $8e_3$ to which the high frequency voltage is applied from the amplifier 39, and the frequency f is switched to coincide with the resonance frequencies of the respective vibrators $8e$. Substantially the same level of cleaning is obtained over the entire surface of wafer W also by switching the frequency as above.

In the above description, the cleaning conditions such as the output pw and frequency f of ultrasonic vibration are varied individually. It is in accordance with the present invention to vary at least one cleaning condition in response to the position of nozzle 8 or the cleaning solution supply position over the surface of wafer W. It is possible to vary, for example, the combination of output pw and frequency f.

The cleaning solution supply position over the surface of wafer W is detected by the encoder 11c acting as the position detecting device. The position detected is used in varying the cleaning conditions such as output pw. The position detecting device of the present invention is not limited to such a construction, but may be modified in various ways. A CCD camera may be used as the position detecting device to detect, from the nozzle 8, an actual cleaning solution supply position over the surface of wafer W, for varying the output power and/or frequency of ultrasonic vibration. Where, for example, the moving speed and moving range of the cleaning solution supply position over the surface of wafer W are known, the cleaning solution supply position may be determined by measuring a time elapsed from a point of time at which the movement started. The cleaning conditions such as the output and/or frequency may be adjusted based thereon.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate cleaning apparatus comprising:
   spin support means for supporting and spinning a substrate;
   a nozzle for discharging a cleaning liquid with a given cleaning condition from a discharge opening;
   moving means for moving said nozzle over a surface of said substrate such that a supply position in which said cleaning liquid discharged from said nozzle is supplied moves at least between center and edge of said substrate;
   discharge pressure adjusting means for adjusting a discharge pressure of said cleaning liquid discharged from said discharge opening of said nozzle; and
   control means for controlling said discharge pressure adjusting means to vary said discharge pressure according to said supply position movable over the surface of said substrate.

2. A substrate cleaning apparatus as defined in claim 1, further comprising position detecting means for detecting said supply position movable over the surface of said substrate, said control means being operable for controlling said discharge pressure adjusting means based on said supply position detected by said position detecting means.

3. A substrate cleaning apparatus as defined in claim 1, wherein said control means is operable for controlling said discharge pressure adjusting means, such that said discharge pressure is low when said supply position is in a central region of said substrate, said discharge pressure being increased as said supply position moves toward the edge of said substrate.

4. A substrate cleaning apparatus as defined in claim 1, wherein said control means is operable for controlling also said moving means to vary a moving speed of said nozzle according to said supply position movable over the surface of said substrate.

5. A substrate cleaning apparatus comprising:
   spin support means for supporting and spinning a substrate;
   a nozzle for discharging a cleaning liquid with a given cleaning condition from a discharge opening;
   moving means for moving said nozzle over a surface of said substrate such that a supply position in which said cleaning liquid discharged from said nozzle is supplied moves at least between center and edge of said substrate;
   discharge height adjusting means for adjusting a discharge height of said discharge opening relative to the surface of said substrate; and
   control means for controlling said discharge height adjusting means to adjust said discharge height according to said supply position movable over the surface of said substrate.

6. A substrate cleaning apparatus as defined in claim 5, further comprising position detecting means for detecting said supply position movable over the surface of said substrate, said control means being operable for controlling said discharge height adjusting means based on said supply position detected by said position detecting means.

7. A substrate cleaning apparatus as defined in claim 5, wherein said control means is operable for controlling also said moving means to vary a moving speed of said nozzle according to said supply position movable over the surface of said substrate.

8. A substrate cleaning apparatus comprising:
   spin support means for supporting and spinning a substrate;
   a nozzle for discharging a cleaning liquid with a given cleaning condition from a discharge opening;
   moving means for moving said nozzle over a surface of said substrate such that a supply position in which said cleaning liquid discharged from said nozzle is supplied moves at least between center and edge of said substrate;
   discharge quantity adjusting means for adjusting a discharge quantity of said cleaning liquid discharged from said nozzle; and
   control means for controlling said discharge quantity adjusting means to adjust said discharge quantity according to said supply position movable over the surface of said substrate.

9. A substrate cleaning apparatus as defined in claim 4, further comprising position detecting means for detecting said supply position movable over the surface of said substrate, said control means being operable for controlling said discharge angle adjusting means based on said supply position detected by said position detecting means.

10. A substrate cleaning apparatus as defined in claim 8, wherein said control means is operable for controlling also said moving means to vary a moving speed of said nozzle according to said supply position movable over the surface of said substrate.

11. A substrate cleaning apparatus comprising;
    spin support means for supporting and spinning a substrate;
    a nozzle for discharging a cleaning liquid with a given cleaning condition from a discharge opening;
    moving means for moving said nozzle over a surface of said substrate such that a supply position in which said cleaning liquid discharged from said nozzle is supplied moves at least between center and edge of said substrate;
    ultrasonic frequency adjusting means for adjusting an ultrasonic frequency applied to said cleaning liquid discharged from said nozzle; and
    control means for controlling said ultrasonic frequency adjusting means to adjust said ultrasonic frequency according to said supply position movable over the surface of said substrate.

12. A substrate cleaning apparatus as defined in claim 11, further comprising position detecting means for detecting said supply position movable over the surface of said substrate, said control means being operable for controlling said ultrasonic frequency adjusting means based on said supply position detected by said position detecting means.

* * * * *